United States Patent
Murao

(10) Patent No.: US 8,736,375 B2
(45) Date of Patent: May 27, 2014

(54) DOHERTY AMPLIFIER

(75) Inventor: Yoji Murao, Tokyo (JP)

(73) Assignee: NEC Corporation, Tokyo (JP)

( * ) Notice: Subject to any disclaimer, the term of this patent is extended or adjusted under 35 U.S.C. 154(b) by 45 days.

(21) Appl. No.: 13/390,947

(22) PCT Filed: Sep. 27, 2010

(86) PCT No.: PCT/JP2010/067299
§ 371 (c)(1),
(2), (4) Date: Feb. 17, 2012

(87) PCT Pub. No.: WO2011/037274
PCT Pub. Date: Mar. 31, 2011

(65) Prior Publication Data
US 2012/0146732 A1    Jun. 14, 2012

(30) Foreign Application Priority Data
Sep. 28, 2009   (JP) ................................ 2009-222033

(51) Int. Cl.
*H03F 3/68*        (2006.01)

(52) U.S. Cl.
USPC .......................................... 330/295; 330/286

(58) Field of Classification Search
USPC ........................... 330/53, 54, 124 R, 286, 295
See application file for complete search history.

(56) References Cited

U.S. PATENT DOCUMENTS

| | | | |
|---|---|---|---|
| 6,545,542 B2* | 4/2003 | Matsuyoshi et al. | 330/295 |
| 6,621,347 B2* | 9/2003 | Morimoto et al. | 330/295 |
| 6,708,022 B1 | 3/2004 | Kurokawa et al. | |
| 6,791,417 B2 | 9/2004 | Pengelly et al. | |
| 6,917,246 B2* | 7/2005 | Thompson | 330/295 |
| 7,342,444 B2* | 3/2008 | Kim et al. | 330/124 R |
| 7,453,320 B2 | 11/2008 | Shiikuma | |
| 8,274,332 B2* | 9/2012 | Cho et al. | 330/295 |
| 2003/0141933 A1 | 7/2003 | Pengelly | |
| 2003/0201833 A1 | 10/2003 | Pengelly et al. | |
| 2003/0210096 A1 | 11/2003 | Pengelly et al. | |
| 2006/0145757 A1* | 7/2006 | Kim et al. | 330/124 R |
| 2007/0103237 A1 | 5/2007 | Shiikuma | |
| 2009/0045878 A1 | 2/2009 | Shiikuma | |

FOREIGN PATENT DOCUMENTS

| | | |
|---|---|---|
| CN | 1781244 | 5/2006 |
| JP | 2004-349563 | 12/2004 |
| JP | 2006-166141 | 6/2006 |
| JP | 2006-525751 | 11/2006 |

(Continued)

OTHER PUBLICATIONS

International Search Report, PCT/JP2010/067299 dated Nov. 9, 2010.

(Continued)

*Primary Examiner* — Khanh V Nguyen
(74) *Attorney, Agent, or Firm* — Young & Thompson

(57) ABSTRACT

A Doherty amplifier has a distributor for branching an input signal into two signals, a carrier amplifier to which one of the signals is inputted from the distributor, a peak amplifier to which another signal of the signals is inputted from the distributor, and a synthesizer for synthesizing output signals from the carrier amplifier and the peak amplifier. The carrier amplifier has a compound semiconductor device with at least two terminals. The peak amplifier has a single element semiconductor device. Bias voltages having the same polarity are applied to the two terminals of the compound semiconductor device.

20 Claims, 3 Drawing Sheets

(56) References Cited

FOREIGN PATENT DOCUMENTS

| | | |
|---|---|---|
| JP | 2007-6164 | 1/2007 |
| JP | 2007-134994 | 5/2007 |
| JP | 2008-017072 | 1/2008 |
| JP | 2008-193720 | 8/2008 |
| JP | 2008-306771 | 12/2008 |
| TW | 409456 | 10/2000 |
| WO | 99-33172 | 7/1999 |

OTHER PUBLICATIONS

Chinese Office Action and Search Report dated Mar. 5, 2014 in corresponding Chinese Patent Application No. 201080043311.6 with English translation of Chinese Office Action.

* cited by examiner

DOHERTY AMPLIFIER

TECHNICAL FIELD

The present invention relates to a Doherty amplifier, and more particularly to an amplifier suitable for wireless communication.

BACKGROUND ART

Recent broadband communication systems have used signals in which a ratio of a peak power to an average power (PAR) is about 10 dB. In such a case, it is necessary to use a high-frequency amplifier that can transmit signals with a peak power that is at least 10 dB higher than an average transmission power at a transmitting stage.

Generally, the power efficiency of an amplifier lowers as a ratio of a peak power to an average transmission power (back-off) increases. On the other hand, eco-conscious trends have demanded reduction of the power consumption in radio systems. Particularly, it has been desired to enhance the efficiency of a high-frequency amplifier, which accounts for a large part of the power consumption of a base station device for cellular phones that needs to have a high output power of at least several tens of watts.

It has been examined to use, as a high-frequency amplifier having a high efficiency with a large back-off, a Doherty-type amplifier for a base station. In the Doherty-type amplifier, only a carrier amplifier operates in a low output power region, whereas both of a carrier amplifier and a peak amplifier operate in a high output power region.

The efficiency can be maximized at an output level at which the peak amplifier starts to operate. Thus, a higher efficiency can be achieved. Furthermore, an output level can be changed such that the efficiency is maximized by changing a ratio of saturation power levels of the carrier amplifier and the peak amplifier.

In the conventional technology, a high-frequency amplifier for a cellular phone base station generally uses an LD-MOSFET (Lateral Diffused Metal-Oxide-Semiconductor Field Effect Transistor) using a material of silicon (Si), which is a single element semiconductor, as a semiconductor device.

Recently, a compound semiconductor represented by gallium nitride, which provides a semiconductor device having a higher efficiency, has been used for semiconductor devices in order to enhance the efficiency of a Doherty-type high-frequency amplifier for a cellular phone base station. Thus, a higher efficiency has been achieved. However, there is a problem that a compound semiconductor is more expensive than a single element semiconductor.

Examples of the related art that can cope with such a problem include JP-A 2008-193720 (Patent document 1). Patent document 1 discloses a Doherty amplifier including a carrier amplifier using a GaAs FET and a peak amplifier using an LD-MOSFET in order to improve the AM-PM characteristics (output power-output phase characteristics).

In general, however, a positive electrode of a bias voltage is applied to a drain of a GaAs FET, and a negative electrode of a bias voltage is applied to a gate of the GaAs FET. Therefore, both of positive and negative polarities are required as power supplies. As a result, there is a problem that a configuration of power supply for applying bias voltages to the amplifier becomes complicated.

DISCLOSURE OF THE INVENTION

Problem(s) to be Solved by the Invention

An object of the present invention is to provide a technology to solve the above problems. It is an object of the present invention to provide a Doherty amplifier having a simplified configuration of power supply for supplying bias voltages.

Means to Solve the Problem

The present invention provides a Doherty amplifier having a distributor for branching an input signal into two signals, a carrier amplifier to which one of the signals is inputted from the distributor, a peak amplifier to which another signal of the signals is inputted from the distributor, and a synthesizer for synthesizing output signals from the carrier amplifier and the peak amplifier.

The carrier amplifier has a compound semiconductor device with at least two terminals.

The peak amplifier has a single element semiconductor device.

Bias voltages having the same polarity are applied to the two terminals of the compound semiconductor device.

Effect(s) of the Invention

According to the present invention, there can be provided a Doherty amplifier having a simplified configuration of power supply for supplying bias voltages.

MODE(S) FOR CARRYING OUT THE INVENTION

Figure 1:
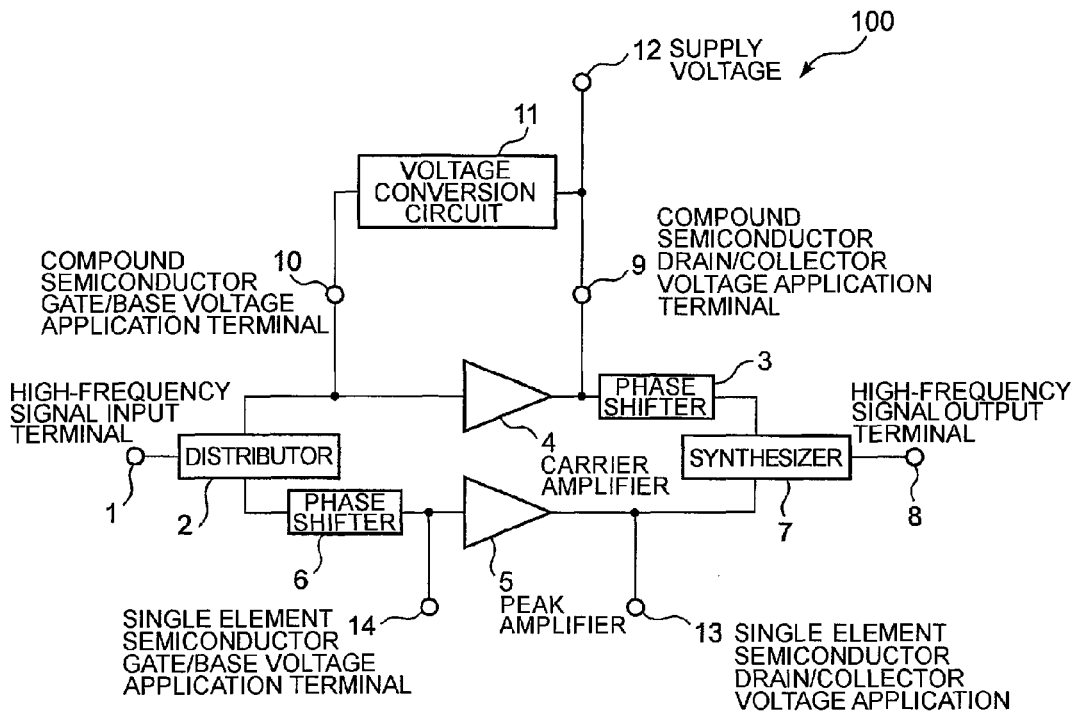
FIG. 1 is a diagram showing a configuration of a Doherty amplifier according to a first embodiment of the present invention.

Embodiments of the present invention will be described below with reference to the drawings.

First Embodiment

A configuration of a Doherty amplifier according to a first embodiment of the present invention will be described below with reference to FIG. 1.

A Doherty amplifier 100 according to the first embodiment of the present invention has a high-frequency signal input terminal 1, a distributor 2, a phase shifter 3, a carrier amplifier 4, a peak amplifier 5, a phase shifter 6, a synthesizer 7, and a high-frequency signal output terminal 8.

In the Doherty amplifier 100, only the carrier amplifier 4 operates in a low output power region, and both of the carrier amplifier 4 and the peak amplifier 5 operate in a high output power region.

The carrier amplifier 4 is formed of a compound semiconductor element, which is highly efficient. On the other hand, the peak amplifier 5 is formed of a single element semiconductor element, which is inexpensive.

The compound semiconductor device of the carrier amplifier 4 may be a field effect transistor or a bipolar transistor. Examples of the compound semiconductor device include an enhanced-mode GaAs HEMT (High Electron Mobility Transistor), an enhanced-mode gallium nitride HEMT, a silicon germanium HBT (Heterojunction Bipolar Transistor), an AlGaAs HBT, and an indium phosphide based HBT. Nevertheless, the compound semiconductor device is not limited to those examples.

Furthermore, the carrier amplifier 4 has a compound semiconductor drain/collector voltage application terminal 9 and a compound semiconductor gate/base voltage application terminal 10. Specifically, the carrier amplifier 4 is formed of a compound semiconductor device, and the compound semiconductor drain/collector voltage application terminal 9 and the compound semiconductor gate/base voltage application terminal 10 are provided on the compound semiconductor device.

Moreover, a voltage conversion circuit 11 is connected between the compound semiconductor drain/collector voltage application terminal 9 and the compound semiconductor gate/base voltage application terminal 10. For example, the voltage conversion circuit 11 is a circuit operable to convert a voltage of about 30 V into a voltage of about 1 V. The voltage conversion circuit 11 is implemented by a general regulator IC or a resistance type potential divider circuit (not shown), or a combination thereof.

A supply voltage 12 is applied to the carrier amplifier 4 (compound semiconductor device) via the voltage conversion circuit 11, the compound semiconductor drain/collector voltage application terminal 9, and the compound semiconductor gate/base voltage application terminal 10. Thus, bias voltages having the same polarity are applied to the two terminals (the compound semiconductor drain/collector voltage application terminal 9 and the compound semiconductor gate/base voltage application terminal 10) of the carrier amplifier 4, which is formed of a compound semiconductor device. Usually, the polarity of the bias voltages is a positive polarity. In the embodiment of the present invention, however, the polarity of the bias voltages is not limited to a positive polarity and may be a negative polarity.

Generally, in a semiconductor device (semiconductor transistor) used in a high-frequency amplifier, a positive voltage is applied to a drain (collector) while a source (emitter) is grounded. A positive voltage or a negative voltage is applied to a gate (base). For example, the reference (MOTOROLA Freescale Semiconductor, Inc. SEMICONDUCTOR APPLICATION NOTE AN211A) discloses in FIG. 9 a depletion-type FET in which a negative voltage is applied to a gate and an enhancement-type FET in which a positive voltage is applied to a gate. Generally, a GaAs based FET, which has heretofore been used as a compound semiconductor for a high-frequency amplifier, is of a depletion-type in which a negative voltage is applied to a gate.

In the first embodiment of the present invention, an enhancement-type FET in which a positive voltage is applied to a gate is used as an example of a compound semiconductor. In a case of a bipolar transistor, for example, a silicon germanium HBT, an AlGaAs HBT, or an indium phosphide based HBT is used, and the same positive polarity is applied to a base as well as a collector.

Meanwhile, the peak amplifier 5, which is formed of a single element semiconductor device, has a single element semiconductor drain/collector voltage application terminal 13 and a single element semiconductor gate/base voltage application terminal 14. Specifically, the peak amplifier 5 is formed of a single element semiconductor device, and the single element semiconductor drain/collector voltage application terminal 13 and the single element semiconductor gate/base voltage application terminal 14 are provided on the single element semiconductor device. A predetermined bias voltage is applied between the single element semiconductor drain/collector voltage application terminal 13 and the single element semiconductor gate/base voltage application terminal 14.

With the above configuration, a high-frequency signal from the high-frequency signal input terminal 1 is inputted to the distributor 2 and branched by the distributor 2. One of the branched signals from the distributor 2 is amplified by the carrier amplifier 4 and then adjusted in phase by the phase shifter 3. The other branched signal from the distributor 2 is amplified by the peak amplifier 5 after it passes through the phase shifter 6. Thereafter, those signals are synthesized by the synthesizer 7 and outputted from the high-frequency signal output terminal 8.

In a case where the power gain differs between the carrier amplifier 4 and the peak amplifier 5 because of different semiconductor processes, a signal distribution ratio of the distributor 2 is varied for compensation. For example, when the power gain of the peak amplifier 5 is twice the power gain of the carrier amplifier 4, a signal distribution ratio of the distributor 2 is set such that the carrier amplifier:the peak amplifier=2:1. Thus, the power gain from the input of the distributor 2 to the output of the carrier amplifier 4 is made equal to the power gain from the input of the distributor 2 to the output of the peak amplifier 5.

Specifically, a distribution ratio of a distributor is set to be 1:1 in a general Doherty amplifier. In a low output power region, in which only a carrier amplifier operates, the power level of a high-frequency signal inputted from a high-frequency signal input terminal is halved (3 dB reduction) by the distributor. Then the signal is amplified by the carrier amplifier and outputted from a high-frequency output terminal after it passes through a phase shifter and a synthesizer. Thus, the power gain of the Doherty amplifier from the high-frequency signal input terminal to the high-frequency output terminal is reduced from the power gain of the carrier amplifier by about 3 dB.

By contrast, in the Doherty amplifier 100 according to the present embodiment, when the power gain of the peak amplifier 5 is twice (3 dB higher than) the power gain of the carrier amplifier 4, for example, the distribution ratio of the distributor 2 is set such that the carrier amplifier:the peak amplifier=2:1. At that time, in a low output power region, in which only the carrier amplifier 4 operates, the power level of a high-frequency signal inputted from the high-frequency signal input terminal 1 becomes ⅔ (1.8 dB reduction) at the distributor 2. Then the signal is amplified by the carrier amplifier 4 and outputted from the high-frequency output terminal 8 after it passes through the phase shifter 3 and the synthesizer 7. Thus, the power gain of the Doherty amplifier 100 from the high-frequency signal input terminal 1 to the high-frequency output terminal 8 is reduced from the power gain of the carrier amplifier by only about 1.8 dB. Thus, the power gain is expected to be improved by 1.2 dB as compared to a general Doherty amplifier.

Furthermore, by changing supply voltages to the carrier amplifier 4 and the peak amplifier 5, the Doherty amplifier 100 is adjusted such that the efficiency is maximized at an operating point of the Doherty amplifier 100.

According to the first embodiment of the present invention, use of a high-efficiency compound semiconductor device for the carrier amplifier 4, which is dominant to the efficiency characteristics of the Doherty amplifier 100, enhances the efficiency of an amplifier as compared to a Doherty amplifier using a general Si-LDMOS.

Furthermore, use of an inexpensive single element semiconductor device for the peak amplifier 5 prevents the price of the Doherty amplifier 100 from increasing.

Moreover, according to the first embodiment of the present invention, since bias voltages having the same polarity are applied to the two terminals (the compound semiconductor drain/collector voltage application terminal 9 and the compound semiconductor gate/base voltage application terminal 10) of the carrier amplifier 4 formed of a compound semiconductor device, a configuration of power supply for applying bias voltages can be simplified as compared to a Doherty amplifier that requires both of positive and negative polarities as power supplies.

As described above, Patent document 1 discloses a Doherty-type amplifier using a GaAs FET for a carrier amplifier and an LD-MOSFET (Lateral Diffused Metal-Oxide-Semiconductor Field Effect Transistor) for a peak amplifier in order to improve the AM-PM characteristics (output power-output phase characteristics).

In general, however, a positive electrode of a bias voltage is applied to a drain of a GaAs FET, which is a compound semiconductor device, and a negative electrode of a bias voltage is applied to a gate of the GaAs FET. Therefore, both of positive and negative polarities are required as power supplies. As a result, a configuration of power supply for applying bias voltages to a Doherty amplifier becomes complicated.

Accordingly, in the first embodiment of the present invention, bias voltages having the same polarity are applied to the two terminals 9 and 10 of the compound semiconductor device that constitutes the carrier amplifier 4 in order to simplify a configuration of power supply for applying bias voltages. At that time, a compound semiconductor device suitable to apply bias voltages having the same polarity to the two terminals 9 and 10 is selected. For example, in a case where bias voltages of the positive polarity are applied to the two terminals 9 and 10, it is preferable to use an indium phosphide based compound semiconductor device or the like as the compound semiconductor device.

Thus, according to the first embodiment of the present invention, a configuration of power supply can be simplified. A compound semiconductor, which exhibits highly efficient performance, can be used for the carrier amplifier 4, and a single element semiconductor, which is inexpensive, can be used for the peak amplifier 5.

Second Embodiment

Figure 2:
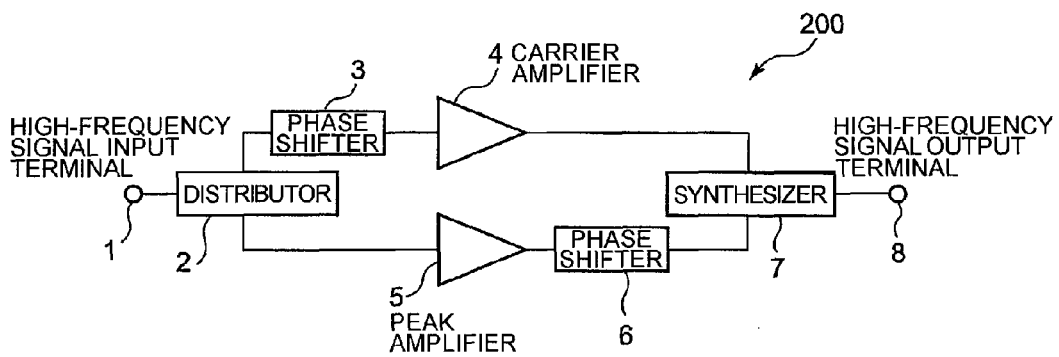
FIG. 2 is a diagram showing a configuration of a Doherty amplifier according to a second embodiment of the present invention.

Next, a configuration of a Doherty amplifier according to a second embodiment of the present invention will be described with reference to FIG. 2.

A Doherty amplifier 200 (inverted Doherty-type) according to the second embodiment has almost the same configuration as the Doherty amplifier 100 according to the first embodiment (see FIG. 1). However, the Doherty amplifier 200 differs from the Doherty amplifier 100 according to the first embodiment in that the phase shifter 3 is arranged on an upstream side of the carrier amplifier 4 and that the phase shifter 6 is arranged on a downstream side of the peak amplifier 5. Other arrangements are the same as those of the Doherty amplifier 100 according to the first embodiment shown in FIG. 1, and the explanation thereof is omitted herein. In FIG. 2, the same components as illustrated in FIG. 1 are denoted by the same reference numerals.

With the above configuration, a high-frequency signal from the high-frequency signal input terminal 1 is inputted to the distributor 2 and branched by the distributor 2. One of the branched signals from the distributor 2 is adjusted in phase by the phase shifter 3 and then amplified by the carrier amplifier 4. The other branched signal from the distributor 2 is amplified by the peak amplifier 5 and then adjusted in phase by the phase shifter 6. Thereafter, those signals are synthesized by the synthesizer 7 and outputted from the high-frequency signal output terminal 8.

According to the second embodiment of the present invention, a configuration of power supply can be simplified as with the first embodiment. A compound semiconductor, which exhibits highly efficient performance, can be used for the carrier amplifier 4, and a single element semiconductor, which is inexpensive, can be used for the peak amplifier 5.

Third Embodiment

Figure 3:
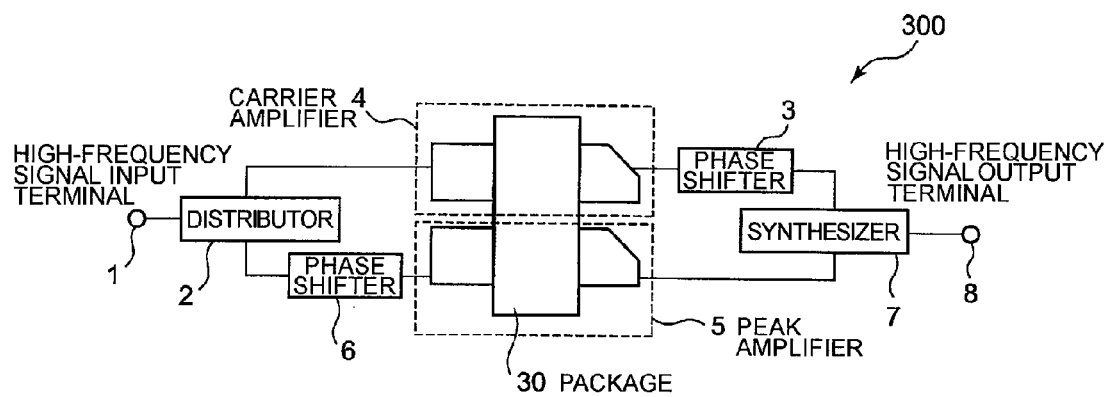
FIG. 3 is a diagram showing a configuration of a Doherty amplifier according to a third embodiment of the present invention.

Next, a Doherty amplifier 300 according to a third embodiment of the present invention will be described with reference to FIG. 3.

The Doherty amplifier 300 according to the third embodiment has almost the same configuration as the Doherty amplifier 100 according to the first embodiment (see FIG. 1). However, the Doherty amplifier 300 differs from the Doherty amplifier 100 according to the first embodiment in that the carrier amplifier 4 and the peak amplifier 5 are provided inside of a single package 30.

In the Doherty amplifier 300 according to the third embodiment, only the carrier amplifier 4 and the peak amplifier 5 are arranged inside of the single package 30. The distributor 2, the phase shifter 3, the phase shifter 6, and the synthesizer 7 are arranged outside of the package 30.

Other arrangements and operations are the same as those of the Doherty amplifier 100 according to the first embodiment shown in FIG. 1, and the explanation thereof is omitted herein. In FIG. 3, the same components as illustrated in FIG. 1 are denoted by the same reference numerals.

A state (imaginary interior) of the single package 30 within which the carrier amplifier 4 and the peak amplifier 5 are provided will be described below with reference to FIG. 4.

A compound semiconductor device 401, which constitutes the carrier amplifier 4, a carrier amplifier input matching circuit 402, a carrier amplifier output matching circuit 403, a high-frequency input/gate (base) voltage dual-purpose terminal 404, and a high-frequency input/drain (collector) voltage dual-purpose terminal 405 are arranged on a metal plate 400.

Furthermore, a single element semiconductor device 406, which constitutes the peak amplifier 5, a peak amplifier input matching circuit 407, a peak amplifier output matching circuit 408, a high-frequency input/gate (base) voltage dual-purpose terminal 409, and a high-frequency output/drain (collector) voltage dual-purpose terminal 410 are arranged on the metal plate 400. Those components are connected in a high-frequency manner by bonding wires 411 or metal patterns. Furthermore, the compound semiconductor device 401 and the single element semiconductor device 406 are connected to the metal plate 400 by a brazing filler metal or the like.

Here, the compound semiconductor device 401, which constitutes the carrier amplifier 4, and the single element semiconductor device 406, which constitutes the peak amplifier 5, may have different coefficients of linear expansion of the semiconductors. At that time, if a material that is optimum for a coefficient of linear expansion of the compound semiconductor device 401 is selected and used for the metal plate 400, on which the compound semiconductor device 401 and the single element semiconductor device 406 are mounted, then mechanical distortions are accumulated on the compound semiconductor device 401, the single element semiconductor device 406, or the metal plate 400 because of a large difference in coefficient of linear expansion between the single element semiconductor device 406 and the compound semiconductor device 401, so that the long-term reliability is lowered.

Therefore, a material having a coefficient of linear expansion that is intermediate between a coefficient of linear expansion of the compound semiconductor device 401, which constitutes the carrier amplifier 4, and a coefficient of linear expansion of the single element semiconductor device 406, which constitutes the peak amplifier 5, is used for the metal plate 400 in the present embodiment. With this selection, mechanically accumulated distortions can be reduced, so that the reliability can be improved.

Figure 4:
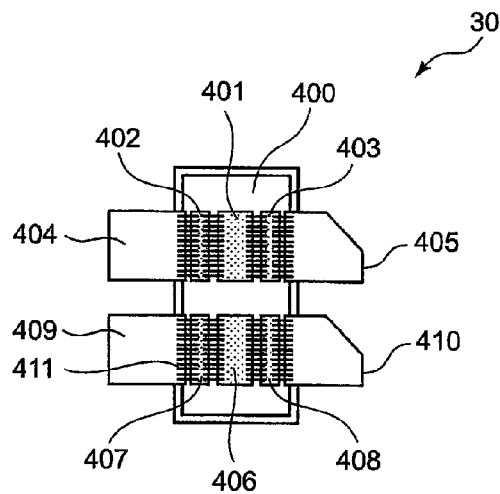
FIG. 4 is a diagram showing a state (imaginary interior) of a single package within which a carrier amplifier and a peak amplifier are provided.

Here, the metal plate 400 is not limited to the form illustrated in FIG. 4 and may be a metal plate formed on a printed board or in an internal layer.

According to the third embodiment of the present invention, a configuration of power supply can be simplified as with the first embodiment. A compound semiconductor, which exhibits highly efficient performance, can be used for the carrier amplifier 4, and a single element semiconductor, which is inexpensive, can be used for the peak amplifier 5.

Furthermore, according to the third embodiment of the present invention, since the carrier amplifier 4 and the peak amplifier 5 are provided within the single package 30, the Doherty amplifier 300 can be made smaller in size as compared to a case where the carrier amplifier 4 and the peak amplifier 5 are provided on separate packages.

Fourth Embodiment

Figure 5:
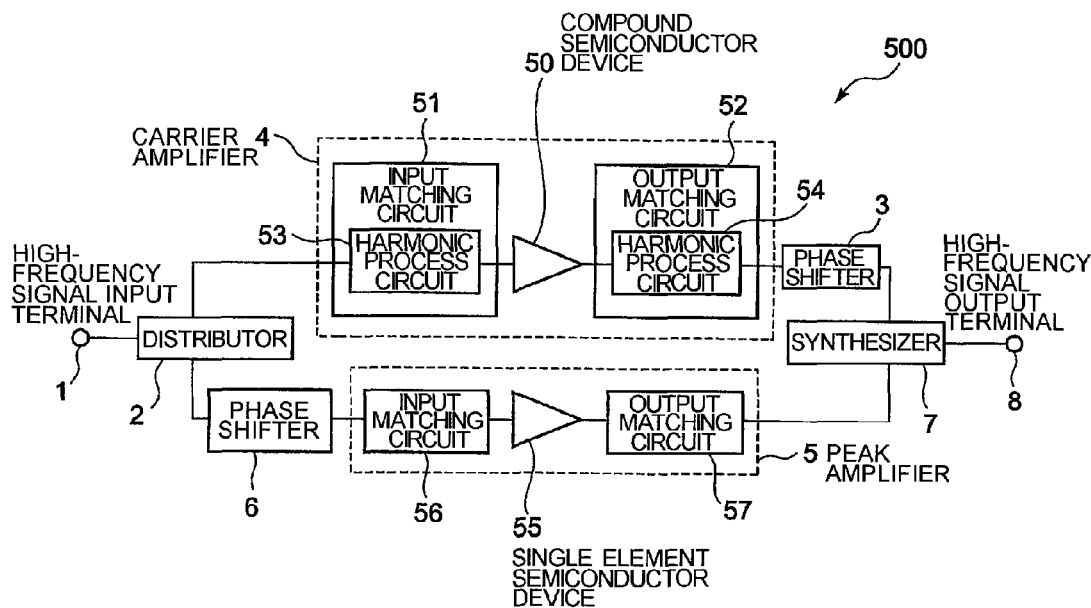
FIG. 5 is a diagram showing a configuration of a Doherty amplifier according to a fourth embodiment of the present invention.

Next, a Doherty amplifier 500 according to a fourth embodiment of the present invention will be described with reference to FIG. 5.

The fourth embodiment is an example in which the efficiency of the carrier amplifier 4 is enhanced by a harmonic process such as class-F or inverse class-F.

The Doherty amplifier 500 according to the fourth embodiment has almost the same configuration as the Doherty amplifier 100 according to the first embodiment (see FIG. 1). However, the Doherty amplifier 500 differs from the Doherty amplifier 100 according to the first embodiment in internal configurations of the carrier amplifier 4 and the peak amplifier 5.

Specifically, the carrier amplifier 4 includes a compound semiconductor device 50, an input matching circuit 51 arranged on an upstream side of the compound semiconductor device 50, and an output matching circuit 52 arranged on a downstream side of the compound semiconductor device 50. The input matching circuit 51 has a harmonic process circuit 53, and the output matching circuit 52 has a harmonic process circuit 54.

Furthermore, the peak amplifier 5 includes a single element semiconductor device 55, an input matching circuit 56 arranged on an upstream side of the single element semiconductor device 55, and an output matching circuit 57 arranged on a downstream side of the single element semiconductor device 55.

Other arrangements and operations are the same as those of the Doherty amplifier 100 according to the first embodiment shown in FIG. 1, and the explanation thereof is omitted herein. In FIG. 5, the same components as illustrated in FIG. 1 are denoted by the same reference numerals.

According to the fourth embodiment of the present invention, a configuration of power supply can be simplified as with the first embodiment. A compound semiconductor, which exhibits highly efficient performance, can be used for the carrier amplifier 4, and a single element semiconductor, which is inexpensive, can be used for the peak amplifier 5.

Furthermore, according to the fourth embodiment of the present invention, the efficiency of the Doherty amplifier 500 can further be enhanced by performing a harmonic process on the carrier amplifier 4.

Fifth Embodiment

Figure 6:
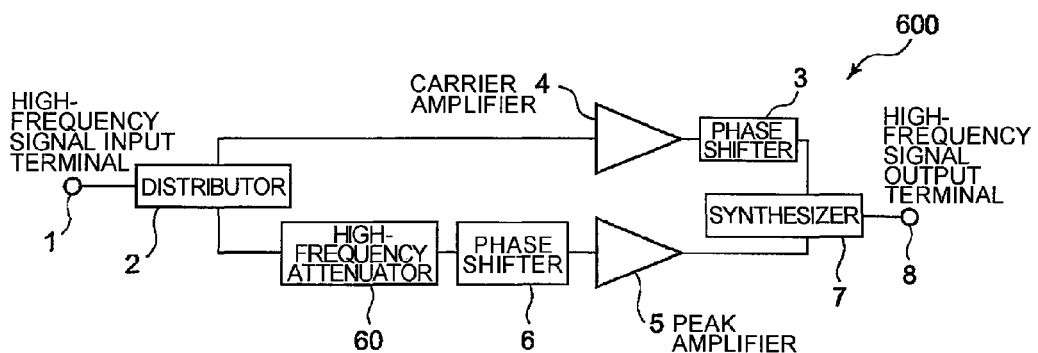
FIG. 6 is a diagram showing a configuration of a Doherty amplifier according to a fifth embodiment of the present invention.

Next, a Doherty amplifier 600 according to a fifth embodiment of the present invention will be described with reference to FIG. 6.

The Doherty amplifier 600 according to the fifth embodiment has almost the same configuration as the Doherty amplifier 100 according to the first embodiment (see FIG. 1). However, the Doherty amplifier 600 differs from the Doherty amplifier 100 according to the first embodiment in that a high-frequency attenuator 60 is provided on an upstream side of the phase shifter 6. Other arrangements and operations are the same as those of the Doherty amplifier 100 according to the first embodiment shown in FIG. 1, and the explanation thereof is omitted herein. In FIG. 6, the same components as illustrated in FIG. 1 are denoted by the same reference numerals.

According to the fifth embodiment of the present invention, a configuration of power supply can be simplified as with the first embodiment. A compound semiconductor, which exhibits highly efficient performance, can be used for the carrier amplifier 4, and a single element semiconductor, which is inexpensive, can be used for the peak amplifier 5.

Furthermore, according to the fifth embodiment of the present invention, when the power gain of the carrier amplifier 4 is greater than the power gain of the peak amplifier 5, a difference of those power gains can be corrected.

Thus, the embodiments of the present invention have specifically been described. The present invention is not limited to the above embodiments. A variety of modifications can be made based upon the technical concept of the present invention.

For example, bias voltages having the same polarity are applied to the two terminals (the compound semiconductor drain/collector voltage application terminal 9 and the compound semiconductor gate/base voltage application terminal 10) of the carrier amplifier 4, which is formed of a compound semiconductor device. Those bias voltages usually have a positive polarity but may have a negative polarity.

Furthermore, bias voltages having the same polarity (e.g., positive electrode) are generally applied to the two terminals (the single element semiconductor drain/collector voltage application terminal 13 and the single element semiconductor gate/base voltage application terminal 14) of the peak amplifier 5, which is formed of a single element semiconductor device. At that time, the bias voltages applied to the two terminals 13 and 14 of the single element semiconductor device may be set to have the same polarity (e.g., positive polarity) as the bias voltages applied to the two terminals 9 and 10 of the compound semiconductor device. This arrangement can provide a Doherty amplifier having a further simplified configuration of power supply for applying bias voltages.

INDUSTRIAL APPLICABILITY

The present invention can widely be applied to base stations for mobile broadband communication such as LTE (Long Term Evolution), WiMAX (Worldwide Interoperability for Microwave Access), and the fourth generation mobile communication system (IMT-Advanced), and to communication between those base stations.

This application is based upon Japanese patent application No. 2009-222033, filed on Sep. 28, 2009, the disclosure of which is incorporated herein in its entirety by reference.

The invention claimed is:

1. A Doherty amplifier, comprising:
a distributor that branches an input signal into two signals;
a carrier amplifier that is given one of the signals from the distributor;
a peak amplifier that is given another of the signals from the distributor; and
a synthesizer that synthesizes output signals from the carrier amplifier and the peak amplifier,
wherein the carrier amplifier includes a compound semiconductor device having at least two terminals,
the peak amplifier includes a single element semiconductor device,
the compound semiconductor device has high-efficiency, the carrier amplifier has an efficiency that is relatively dominant to an efficiency of the Doherty amplifier, and the single element semiconductor device has an efficiency that is not relatively dominant to the efficiency of the Doherty amplifier, and
bias voltages having the same polarity are applied to the two terminals of the compound semiconductor device.

2. The Doherty amplifier as recited in claim 1, wherein the compound semiconductor device is a field effect transistor, and the two terminals of the compound semiconductor device are a drain terminal and a gate terminal of the field effect transistor.

3. The Doherty amplifier as recited in claim 2, wherein the field effect transistor is an HEMT, and the single element semiconductor device is an LD-MOSFET.

4. The Doherty amplifier as recited in claim 3, wherein the HEMT is a gallium nitride based HEMT, and the LD-MOSFET is a silicon based LD-MOSFET.

5. The Doherty amplifier as recited in claim 1, wherein the compound semiconductor device is a bipolar transistor, and the two terminals of the compound semiconductor device are a collector terminal and a base terminal of the bipolar transistor.

6. The Doherty amplifier as recited in claim 5, wherein the bipolar transistor is an HBT, and the single element semiconductor device is an LD-MOSFET.

7. The Doherty amplifier as recited in claim 6, wherein the HBT is an indium phosphide based HBT, and the LD-MOSFET is a silicon based LD-MOSFET.

8. The Doherty amplifier as recited in claim 1, wherein distribution ratios of the distributor for the carrier amplifier and the peak amplifier are set to be different from each other when a power gain of the carrier amplifier is different from a power gain of the peak amplifier.

9. The Doherty amplifier as recited in claim 8, wherein the distribution ratio of the distributor for the carrier amplifier is set to be higher than the distribution ratio of the distributor for the peak amplifier when the power gain of the peak amplifier is greater than the power gain of the carrier amplifier.

10. The Doherty amplifier as recited in claim 1, wherein the carrier amplifier and the peak amplifier are arranged in a single semiconductor package.

11. The Doherty amplifier as recited in claim 10, wherein that the compound semiconductor device and the single element semiconductor device are connected to a metal plate of the semiconductor package, and
a coefficient of linear expansion of a material of the metal plate has a value intermediate between a coefficient of linear expansion of the compound semiconductor device and a coefficient of linear expansion of the single element semiconductor device.

12. The Doherty amplifier as recited in claim 1, wherein a first phase shifter is arranged on a downstream side of the carrier amplifier, and a second phase shifter is arranged on an upstream side of the peak amplifier.

13. The Doherty amplifier as recited in claim 12, wherein a high-frequency attenuator is arranged on an upstream side of the second phase shifter.

14. The Doherty amplifier as recited in claim 1, wherein a first phase shifter is arranged on an upstream side of the carrier amplifier, and a second phase shifter is arranged on a downstream side of the peak amplifier.

15. The Doherty amplifier as recited in claim 1, wherein the carrier amplifier further includes an input matching circuit arranged on an upstream side of the compound semiconductor device and an output matching circuit arranged on a downstream side of the compound semiconductor device.

16. The Doherty amplifier as recited in claim 1, wherein the peak amplifier further includes an input matching circuit arranged on an upstream side of the single element semiconductor device and an output matching circuit arranged on a downstream side of the single element semiconductor device.

17. The Doherty amplifier as recited in claim 1, wherein an efficiency of the Doherty amplifier is adjusted so as to be maximized at an operating point by varying supply voltages of the carrier amplifier and the peak amplifier.

18. The Doherty amplifier as recited in claim 1, wherein the single element semiconductor device has at least two terminals, and bias voltages having the same polarity are applied to the two terminals of the single element semiconductor device.

19. The Doherty amplifier as recited in claim 18, wherein the bias voltages applied to the two terminals of the single element semiconductor device have the same polarity as the bias voltages applied to the two terminals of the compound semiconductor device.

20. The Doherty amplifier as recited in claim 19, wherein the bias voltages applied to the two terminals of the single element semiconductor device and the bias voltages applied to the two terminals of the compound semiconductor device have a positive polarity.

* * * * *